(12) United States Patent
Fukuda

(10) Patent No.: US 8,072,830 B2
(45) Date of Patent: *Dec. 6, 2011

(54) LOGIC EMBEDDED MEMORY HAVING REGISTERS COMMONLY USED BY MACROS

(75) Inventor: Ryo Fukuda, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 228 days.

This patent is subject to a terminal disclaimer.

(21) Appl. No.: 12/437,123

(22) Filed: May 7, 2009

(65) Prior Publication Data

US 2009/0213672 A1    Aug. 27, 2009

Related U.S. Application Data

(63) Continuation of application No. 11/190,008, filed on Jul. 27, 2005, now Pat. No. 7,548,472.

(30) Foreign Application Priority Data

Jan. 14, 2005    (JP) ................................ 2005-008138

(51) Int. Cl.
     *G11C 29/08*      (2006.01)
(52) U.S. Cl. ................. 365/225.7; 365/189.05; 714/718
(58) Field of Classification Search .................. None
See application file for complete search history.

(56) References Cited

U.S. PATENT DOCUMENTS

| | | | |
|---|---|---|---|
| 5,634,015 A | 5/1997 | Chang et al. | |
| 6,363,020 B1 | 3/2002 | Shubat et al. | |
| 6,601,199 B1 | 7/2003 | Fukuda et al. | |
| 6,804,156 B2 | 10/2004 | Ito | |
| 7,460,413 B2 | 12/2008 | Tooher | |
| 2003/0151966 A1 | 8/2003 | Demone | |
| 2004/0066684 A1* | 4/2004 | Ito | 365/201 |
| 2004/0165467 A1* | 8/2004 | Sasaki et al. | 365/225.7 |
| 2005/0050421 A1 | 3/2005 | Enkaku | |

FOREIGN PATENT DOCUMENTS

| | | |
|---|---|---|
| JP | 8-204161 A | 8/1996 |
| JP | 8-254570 A | 10/1996 |

(Continued)

OTHER PUBLICATIONS

Michael R. Ouellette, et al., "Shared Fuse Macro for Multiple Embedded Memory Devices with Redundancy", IEEE Custom Integrated Circuits Conference Digest, 2001, pp. 191-194.

Japanese Office Action issued Jan. 18, 2011, in Patent Application No. 2005-008138 (with English Translation).

(Continued)

*Primary Examiner* — Kaushikkumar Patel
(74) *Attorney, Agent, or Firm* — Oblon, Spivak, McClelland, Maier & Neustadt, L.L.P.

(57) ABSTRACT

A semiconductor integrated circuit device includes a plurality of memory macros, macro-common register block, and memory macro operation setting circuits. The macro-common register block has macro-common registers which are provided outside the plurality of memory macros and supply memory macro operation specifying signals to the plurality of memory macros. The memory macro operation setting circuits are respectively provided in the plurality of memory macros and are each configured to set an operating state of the memory macro in response to the memory macro operation specifying signal supplied from the macro-common register.

16 Claims, 7 Drawing Sheets

FOREIGN PATENT DOCUMENTS

| | | |
|---|---|---|
| JP | 2000-133000 A | 5/2000 |
| JP | 2000-164811 A | 6/2000 |
| JP | 2002-25292 A | 1/2002 |
| JP | 2003-109395 A | 4/2003 |
| JP | 2003-233999 A | 8/2003 |

OTHER PUBLICATIONS

Japanese Office Action issued on Apr. 12, 2011 in corresponding Japanese Application No. 2005-008138 (with an English Translation).

* cited by examiner

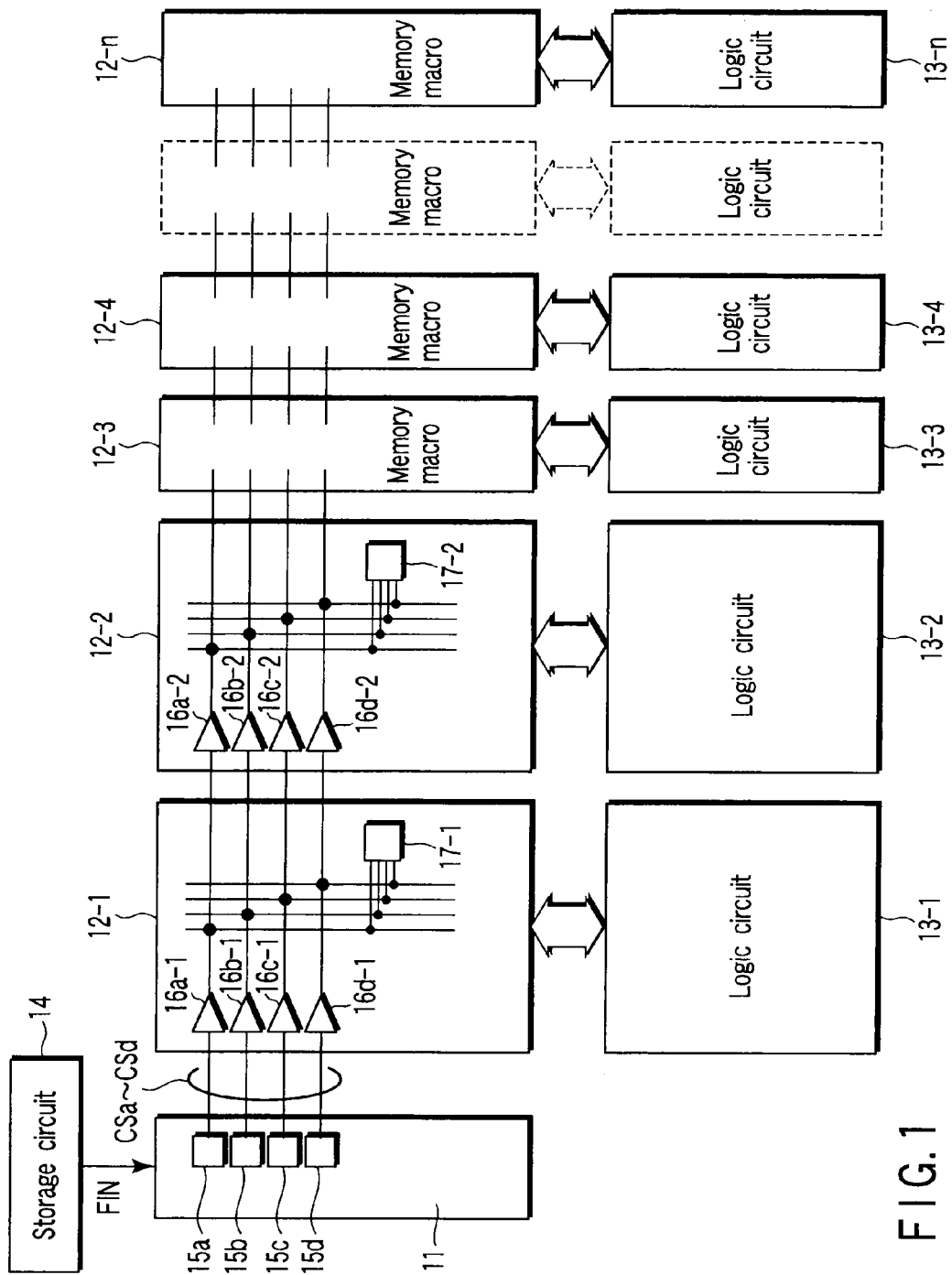
F I G. 1

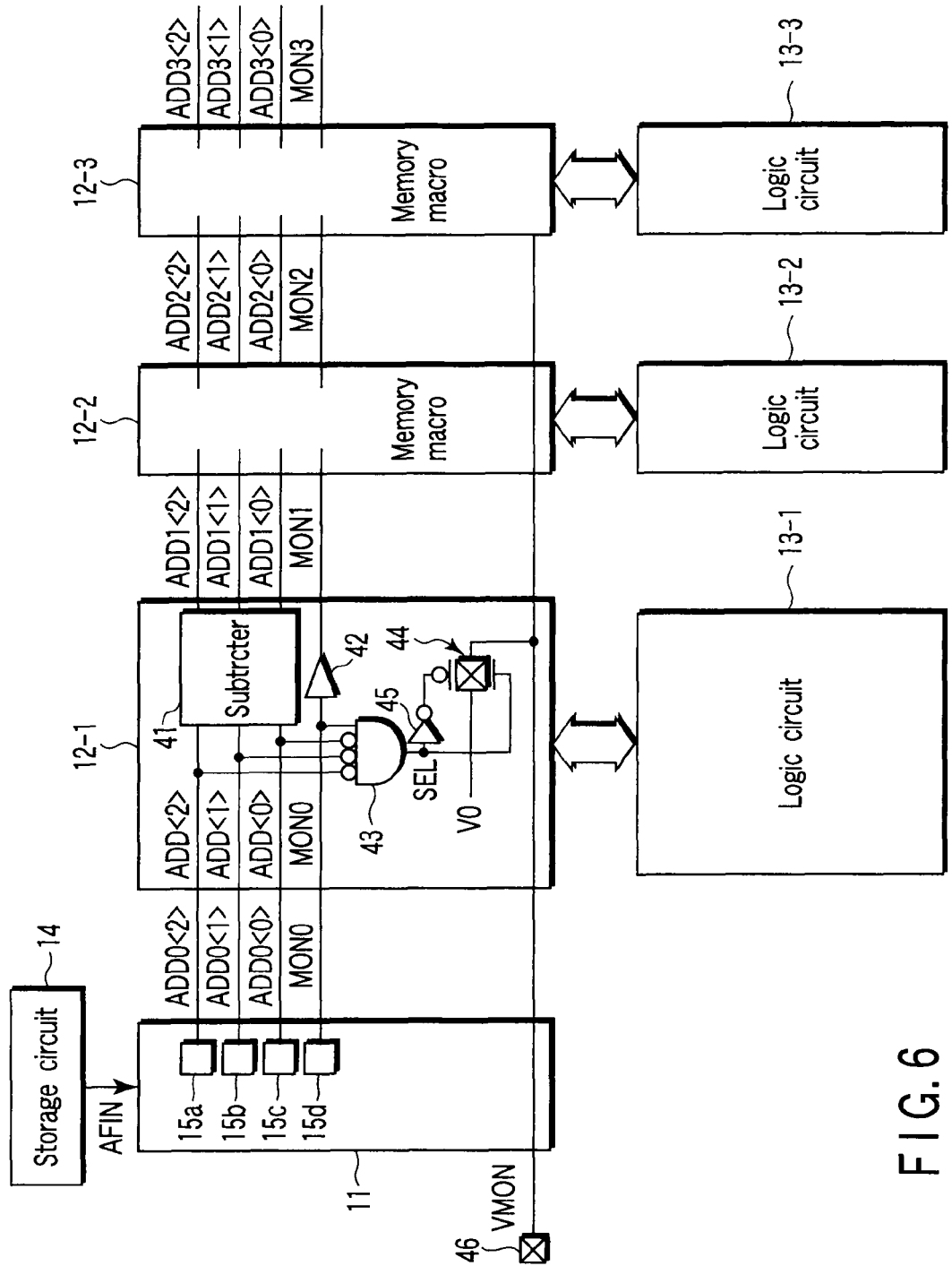
F I G. 6 and is based upon and claims the benefit of priority from prior Japanese Patent Application No. 2005-008138, filed Jan. 14, 2005, the entire contents of which are incorporated herein by reference.

LOGIC EMBEDDED MEMORY HAVING REGISTERS COMMONLY USED BY MACROS

CROSS-REFERENCE TO RELATED APPLICATIONS

This application is a Continuation of U.S. application Ser. No. 11/190,008, filed Jul. 27, 2005, and is based upon and claims the benefit of priority from prior Japanese Patent Application No. 2005-008138, filed Jan. 14, 2005, the entire contents of which are incorporated herein by reference.

BACKGROUND OF THE INVENTION

1. Field of the Invention

This invention relates to a semiconductor integrated circuit device such as a logic embedded memory having a logic circuit and a memory integrated in one chip.

2. Description of the Related Art

Recently, in a semiconductor integrated circuit device such as a logic embedded memory, as the integration density becomes higher, the capacity of the memory portion becomes larger. If a memory macro of a large capacity is formed in the logic embedded memory, it becomes difficult to receive/transmit a signal with respect to the logic circuit and the performance is deteriorated by distributing a clock in the memory macro. Therefore, a large number of memory macros of middle- or small-size capacities are arranged in many cases. For example, if a memory having a total capacity of 32 Mbits is required, four memory macros of 8 Mbits are formed.

Further, in the logic embedded memory, the requirement for the performance becomes severer and a setting value of an internal timer and voltage of an internal power supply of the memory macro configured by a DRAM can be finely tuned. Therefore, the setting value of the internal timer and voltage of the internal power supply are previously stored in a nonvolatile storage circuit such as fuses, ROM or the like. Since the arrangement of the nonvolatile storage circuit such as fuses, ROM or the like is limited in many respects, it is not provided in the memory macro but provided outside the memory macro and memory data is serially transferred to registers provided in the memory macro in the initialization sequence for startup of the power supply. Then, the setting value of the internal timer and the internal power supply voltage are tuned based on the data transferred to the registers (for example, refer to "Shared Fuse Macro for Multiple Embedded Memory Devices with Redundancy", Micheal R, et al., IEEE2001 CUSTOM INTEGRATED CIRCUITS CONFERENCE DIGEST pp. 191-194). At this time, in order to enhance the robustness of the data transfer operation, a receiving circuit which receives data read out from the memory circuit is provided and a complicated transfer protocol is used in some cases.

However, if a large number of memory macros of small capacities are formed, it is required to provide a large number of registers, internal timing setting circuits which set the setting values of the internal timers and internal voltage setting circuits which set the voltages of the internal power supplies in the memory macros. As a result, the pattern-occupied area becomes larger in comparison with a case wherein a small number of memory macros of large capacities are formed. In addition, if the data receiving circuit is provided in each memory macro, the pattern-occupied area is further increased.

BRIEF SUMMARY OF THE INVENTION

According to an aspect of the invention, there is provided a semiconductor integrated circuit device comprising a plurality of memory macros having memory cells which store data, a macro-common register block provided outside the plurality of memory macros and having macro-common registers which supply macro operation specifying signals to the plurality of memory macros, and memory macro operation setting circuits which are respectively provided in the plurality of memory macros and configured to set operating states of the memory macros according to the memory macro operation specifying signals supplied from the macro-common registers.

According to another aspect of the invention, there is provided a semiconductor integrated circuit device comprising a plurality of memory macros having memory cells which store data, a macro-common register block provided outside the plurality of memory macros and having macro-common registers which supply address signals and a monitor signal to the plurality of memory macros, and memory macro operation setting circuits which are respectively provided in the plurality of memory macros and configured to set operating states of the memory macros according to the address signals and the monitor signal, the memory macro operation setting circuits having adders or subtracters each supplied with the address signals and in which an output signal of the adders or subtracters is supplied to a next-stage memory macro.

BRIEF DESCRIPTION OF THE SEVERAL VIEWS OF THE DRAWING

FIG. 1 is a block diagram showing the schematic configuration of an extracted main portion of a logic embedded memory, for illustrating a semiconductor integrated circuit device according to a first embodiment of this invention;

FIG. 6 is a block diagram showing the schematic configuration of an extracted main portion of a logic embedded memory, for illustrating a semiconductor integrated circuit device according to a third embodiment of this invention;

DETAILED DESCRIPTION OF THE INVENTION

Figure 2:
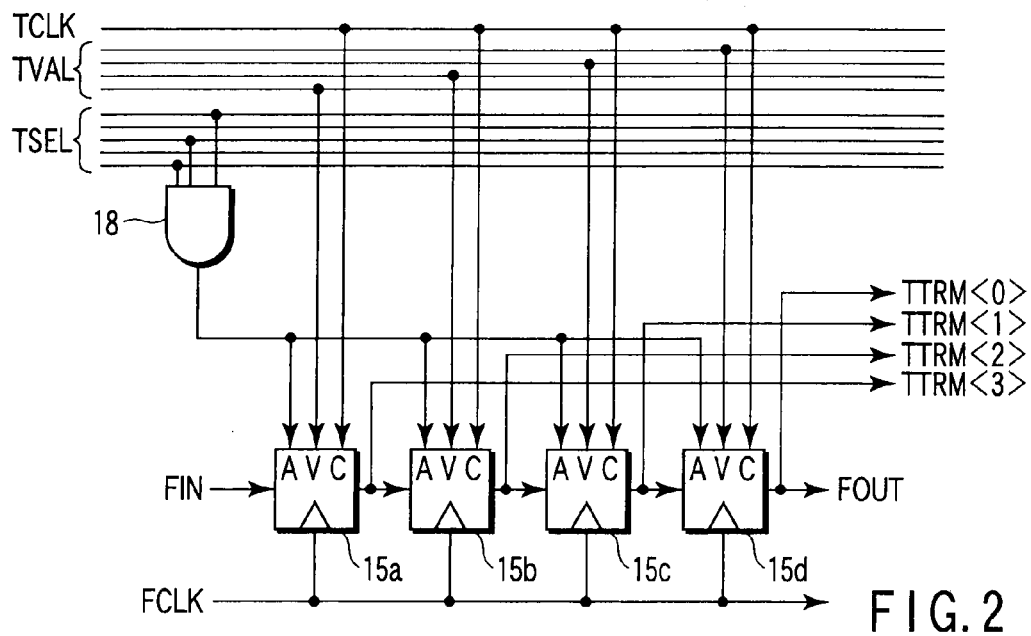
FIG. 2 is a circuit diagram showing an extracted data program circuit which programs data into macro-common registers shown in FIG. 1.

FIG. 1 is a block diagram showing the schematic configuration of an extracted main portion of a logic embedded memory, for illustrating a semiconductor integrated circuit device according to a first embodiment of this invention. The logic embedded memory includes a macro-common register block 11, memory macros 12-1 to 12-n, logic circuits 13-1 to 13-n and storage circuit (nonvolatile memory) 14.

The macro-common register block 11 is commonly used by the memory macros 12-1 to 12-n. The macro-common register block 11 includes macro-common registers 15a to 15d which latch data FIN such as setting values of internal timers and voltages of internal power supplies stored in the storage circuit 14 at the turn-ON time of the power supply. The macro-common registers 15a to 15d form a serial chain. That is, the macro-common registers 15a to 15d are configured so that data FIN input from the storage circuit 14 to the macro-common register 15a will be sequentially transferred from the preceding-stage macro-common register to the next-stage macro-common register. In this example, for simplicity of the explanation, n memory macros and four macro-common registers are provided, but a desired number of memory macros and macro-common registers can be used if they are provided in a plural form.

The memory macros 12-1 to 12-n are serially connected to sequentially distribute memory macro operation specifying signals CSa to CSd output from the macro-common registers 15a to 15d to the memory macros 12-1 to 12-n in a chain form.

The memory macro 12-1 includes buffers 16a-1 to 16d-1 and a memory macro operation setting circuit 17-1. The buffers 16a-1 to 16d-1 are provided at the input stage of the memory macro 12-1. The buffers 16a-1 to 16d-1 function to prevent transmission of noise when the memory macro operation specifying signals CSa to CSd are transmitted across the memory macros 12-1 to 12-n. Output signals of the buffers 16a to 16d are supplied to the next-stage memory macro 12-2 and, at the same time, supplied to the memory macro operation setting circuit 17-1. The memory macro operation setting circuit 17-1 sets the operation state of the memory macro 12-1 in response to the memory macro operation specifying signals CSa to CSd.

The other memory macros 12-2 to 12-n have substantially the same circuit configuration and the same pattern layout as those of the memory macro 12-1. The memory macro operation specifying signals CSa to CSd output from the macro-common registers 15a to 5d are commonly input to each of the memory macro operation setting circuits 17-1 to 17-n to control and set each of the memory macros 12-1 to 12-n into the same state. For example, the memory macro operation setting circuits 17-1 to 17-n are internal timing setting circuits which determine setting values of internal timers to determine timings of operations of the memory macros or internal voltage setting circuits which set voltages of internal power supplies in the memory macros.

The logic circuits 13-1 to 13-n are provided in correspondence to the memory macros 12-1 to 12-n and transfer data with respect to the corresponding memory macros 12-1 to 12-n. For example, data read out from the memory macro is logically processed by a corresponding one of the logic circuits and the data logically processed by the logic circuit is programmed into a corresponding one of the memory macros.

FIG. 2 is a circuit diagram showing an extracted data program circuit which programs data into the macro-common registers 15a to 15d in the macro-common register block 11 shown in FIG. 1. Data FIN read out from the storage circuit (ROM or fuse circuit) 14 is input to the macro-common register 15a which is the first-stage register of the serial chain. The serial chain (macro-common registers 15a to 15d) is driven by a clock signal FCLK. An output signal FOUT of the final-stage macro-common register 15d of the serial chain is supplied to a next serial chain.

Further, the macro-common registers 15a to 15d are each configured to fetch a signal supplied to the terminal V if a signal input to the terminal A is active at the rise time of a signal input to the terminal C. Thus, a path which directly sets data is provided in addition to a path which latches data from the storage circuit 14. That is, an output signal of a decoder (AND circuit) 18 is commonly input to the terminals A of the macro-common registers 15a to 15d, different signals TVAL are input to the respective terminals V and a common signal TCLK is input to the terminals C. The decoder 18 is selectively supplied with signals TSEL. Thus, a signal TVAL can be programmed into one register group (serial chain) which is selected by the signal TSEL in response to a rise of the signal TCLK.

Figure 3:
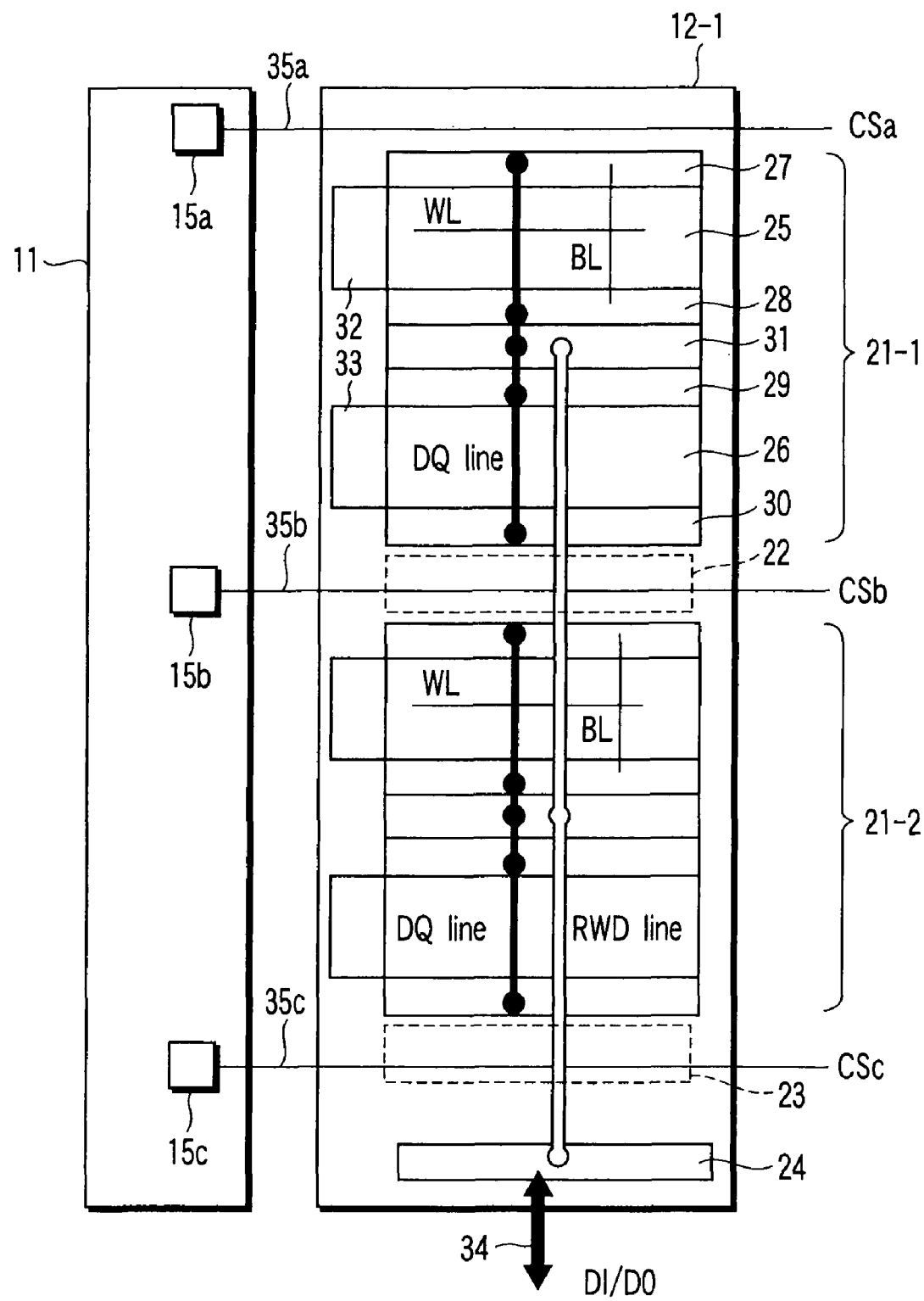
FIG. 3 is a block diagram showing a concrete example of a portion of signal lines which transmit macro operation state specifying signals in a memory macro shown in FIG. 1.

FIG. 3 is a block diagram showing a concrete example of a portion of signal lines which transmit macro operation state specifying signals in the memory macro 12-1 shown in FIG. 1. In the circuit portion, array segments 21-1, 21-2, decoupling capacitor 22, internal power supply voltage generating circuit 23 and input/output buffer 24 are contained.

Memory cell arrays 25, 26, sense amplifiers 27 to 30, secondary sense amplifier 31 and row decoders 32, 33 are contained in the array segment 21-1. The sense amplifiers 27, 28 are arranged to sandwich the memory cell array 25 and data in the memory cell in the memory cell array 25 is read out via the sense amplifier 27, 28 or data is programmed therein via the sense amplifier 27, 28. The row decoder 32 selects and activates one of word lines WL in the memory cell array 25. The word lines WL and bit lines BL are arranged to cross one another and memory cells are respectively provided at intersections between the word lines WL and the bit lines BL. The bit line BL is formed of a first-level metal layer and connected to the sense amplifiers 27, 28. The word line WL is formed of a polysilicon layer, which is the same as the gate electrode of a cell transistor configuring the memory cell, and is backed with a second-level metal layer.

The sense amplifiers 29, 30 are arranged to sandwich the memory cell array 26 and data in the memory cell in the memory cell array 26 is read out via the sense amplifier 29, 30 or data is programmed therein via the sense amplifier 29, 30. The row decoder 33 selects and activates one of word lines WL in the memory cell array 26. The word lines WL and bit lines BL are arranged to cross one another and memory cells are respectively provided at intersections between the word lines WL and the bit lines BL. The bit line BL is formed of a first-level metal layer and connected to the sense amplifiers 29, 30. The word line WL is formed of a polysilicon layer, which is the same as the gate electrode of a cell transistor configuring the memory cell, and is backed with a second-level metal layer.

The secondary sense amplifier 31 is provided between the sense amplifiers 28 and 29. The secondary sense amplifier 31 is connected to the sense amplifiers 27 to 30 via a DQ line, transfers data with respect to one of the sense amplifiers 27 to 30 and programs or reads out data with respect to a memory cell in the memory cell array 25 or 26. The DQ line is formed of a third-level metal layer and formed to extend in the same direction as the bit line BL.

The array segment 21-2 has substantially the same configuration as that of the array segment 21-1.

The decoupling capacitor 22 is provided between the array segments 21-1 and 21-2. The internal power supply voltage generating circuit 23 and input/output buffer 24 are provided adjacent to the array segment 21-2. The input/output buffer 24 and the secondary sense amplifiers 31 in the array segments 21-2 and 21-2 are connected together by use of an RWD line. The RWD line is formed to extend in the same direction as the DQ line and bit line BL and formed of a fifth-level metal layer. Data from the secondary sense amplifier 31 in the array segment 21-1, 21-2 is supplied to the input/output buffer 24 via the RWD line. Data DI/DO is input/output to or from the input/output buffer 24 via an input/output line 34. The input/output line 34 is formed to extend in the same direction as that of the RWD line, DQ line and bit line BL.

The memory macro operation state specifying signal CSa is sequentially distributed to the memory macros 12-1 to 12-$n$ by use of a signal line 35$a$ which is formed to extend in the same direction (the arrangement direction of the memory macros 12-1 to 12-$n$) as that of the word line WL on a space region between the end portion of the memory macro 12-1 and the sense amplifier 27. Further, the memory macro operation state specifying signal CSb is sequentially distributed to the memory macros 12-1 to 12-$n$ by use of a signal line 35$b$ which is formed to extend in the same direction as that of the word line WL on the decoupling capacitor 22. Also, the memory macro operation state specifying signal CSc is sequentially distributed to the memory macros 12-1 to 12-$n$ by use of a signal line 35$c$ which is formed to extend in the same direction as that of the word line WL on the internal power supply voltage generating circuit 23. The signal lines 35$a$, 35$b$, 35$c$ are each formed of a fourth-level metal layer.

In FIG. 3, a case wherein one signal line is arranged on each of the space region, decoupling capacitor 22 and internal power supply voltage generating circuit 23 is explained. However, it is also possible to provide a plurality of signal lines according to the width of each region and the required number of memory macro operation state specifying signals or provide all of the signal lines on one of the regions.

With the above configuration, since the macro-common registers 15$a$ to 15$d$ can be commonly used by a plurality of memory macros 12-1 to 12-$n$, the pattern-occupied area can be reduced.

Further, as shown in FIG. 2, since a path which directly sets data is provided in addition to the data path from the storage circuit 14 in the macro-common registers 15$a$ to 15$d$, not only previously stored data but also required data can be set and the degree of freedom of the user can be enhanced.

Further, as shown in FIG. 3, an influence by the operation noise caused by the presence of the DQ line can be prevented and the noise resistance can be enhanced by arranging the signal lines 35$a$, 35$b$, 35$c$ to avoid the DQ lines formed to extend on the memory cell array and distributing the memory macro operation state specifying signals CSa, CSb, CSc to the signal lines. Particularly, since the signal line 35$a$ passes through a region on the uppermost portion of the array in which the RWD line is not provided, an influence due to the operation noise caused by the presence of the RWD line can be prevented and the noise resistance can be further enhanced. In addition, since the rate of usage of the third-level metal layer in the decoupling capacitor 22 and internal power supply voltage generating circuit 23 is low, the noise resistance can further be enhanced in this respect.

Second Embodiment

Figure 4:
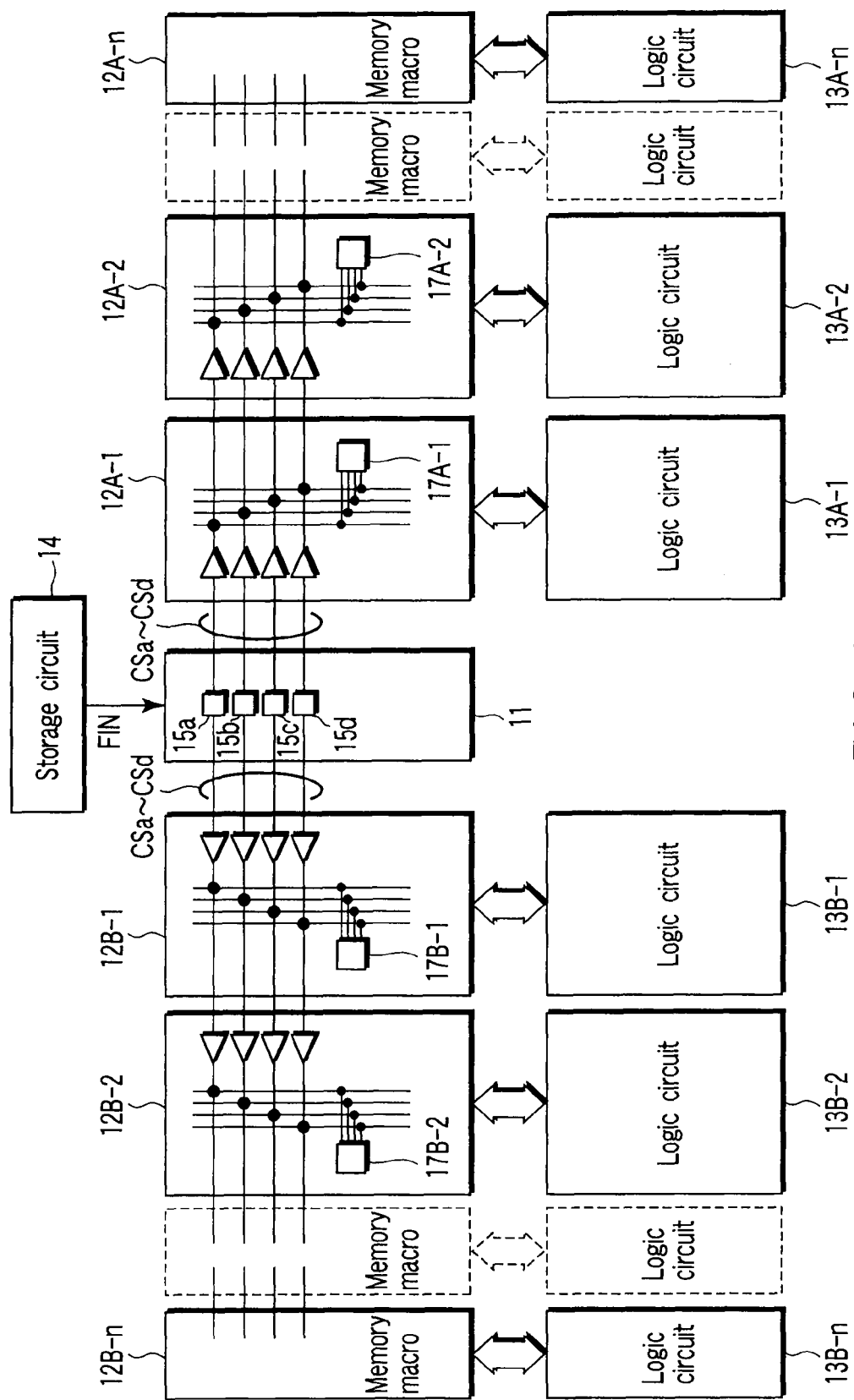
FIG. 4 is a block diagram showing the schematic configuration of an extracted main portion of a logic embedded memory, for illustrating a semiconductor integrated circuit device according to a second embodiment of this invention.

FIG. 4 is a block diagram showing the schematic configuration of an extracted main portion of a logic embedded memory, for illustrating a semiconductor integrated circuit device according to a second embodiment of this invention. The logic embedded memory includes a macro-common register block 11, memory macros 12A-1 to 12A-n, 12B-1 to 12B-n, logic circuits 13A-1 to 13A-n, 13B-1 to 13B-n and storage circuit (nonvolatile memory) 14.

That is, the memory macros 12A-1 to 12A-n and the memory macros 12B-1 to 12B-n are arranged to sandwich the macro-common register block 11 and the logic circuits 13A-1 to 13A-n, 13B-1 to 13B-n are provided in correspondence to the memory macros 12A-1 to 12A-n, 12B-1 to 12B-n.

Figure 5C:
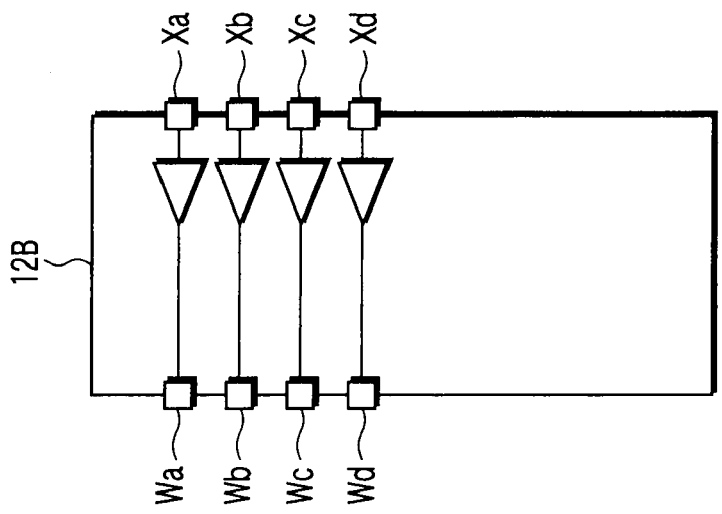
FIGS. 5A to 5C are schematic diagrams for illustrating the arrangement of terminals of the macro-common register block and memory macros.
Figure 5B:
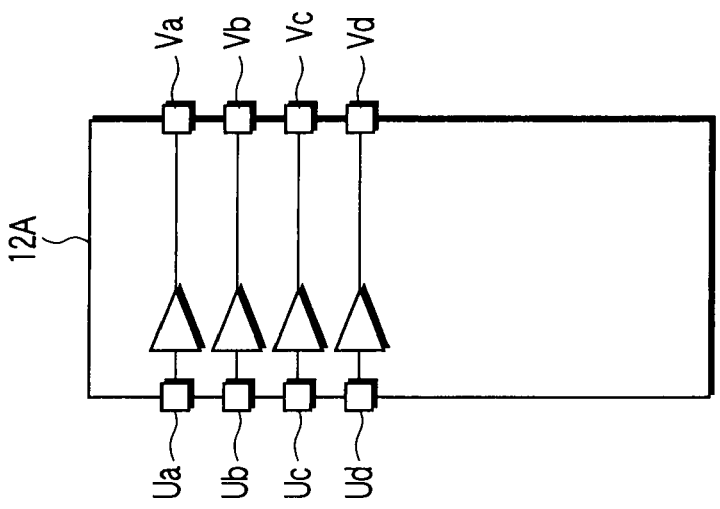
Figure 5A:
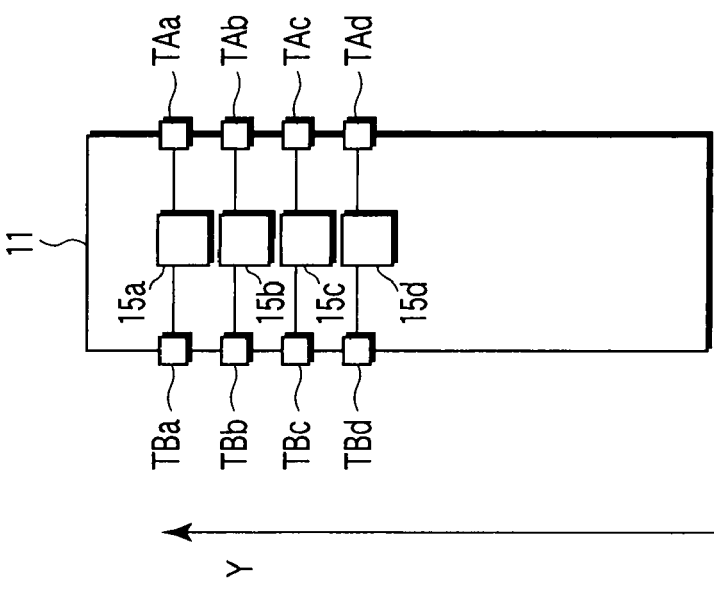

As shown in FIG. 5A, the macro-common register block 11 has macro operation state specifying signal output terminals TAa to TAd and TBa to TBd provided in the same Y positions on opposite two sides. Memory macro operation specifying signals CSa to CSd are output from macro-common registers 15$a$ to 15$d$ connected to the signal terminals TAa to TAd and TBa to TBd. Further, as shown in FIG. 5B, each of the memory macros 12A-1 to 12A-n has macro operation state specifying signal input terminals Ua to Ud and output terminals Va to Vd in the same Y positions as those of the macro operation state specifying signal output terminals TAa to TAd. The memory macros 12B-1 to 12B-n have the same configurations as those of the memory macros 12A-1 to 12A-n and have pattern layouts symmetrical to the memory macros 12A-1 to 12A-n with the macro-common register block 11 disposed therebetween. As shown in FIG. 5C, each of the memory macros 12B-1 to 12B-n has macro operation state specifying signal input terminals Wa to Wd and output terminals Xa to Xd in the same Y positions as those of the macro operation state specifying signal output terminals TAa to TAd.

The memory macros 12A-1 to 12A-n are serially connected and memory macro operation specifying signals CSa to CSd output from the macro-common registers 15$a$ to 15$d$ are sequentially distributed to the next-stage memory macro in a chain fashion. Likewise, the memory macros 12B-1 to 12B-n are serially connected and the memory macro operation specifying signals CSa to CSd output from the macro-common registers 15$a$ to 15$d$ are sequentially distributed to the next-stage memory macro in a chain fashion.

Thus, the positions of the signal lines of the memory macro operation specifying signals CSa to CSd in the macro-common register block 11 and memory macros 12A-1 to 12A-n and 12B-1 to 12B-n and the input/output terminals are defined. Further, the memory macros 12A-1 to 12A-n and 12B-1 to 12B-n are arranged by tiling in a symmetrical form on both sides of the macro-common register block 11. Thus, the degree of freedom of the arrangement of the memory macros can be enhanced.

Third Embodiment

Next, a semiconductor integrated circuit device according to a third embodiment of this invention is explained with reference to FIG. 6. FIG. 6 is a block diagram showing an extracted main portion of a logic embedded memory. In the present embodiment, one of memory macros 12-1, 12-2, 12-3, . . . commonly using registers 15$a$ to 15$d$ is selected by use of a macro-common register block 11 and the internal power supply of the selected memory macro is connected to a power supply monitoring pad. Thus, a test can be made.

Like the first embodiment, the logic embedded memory includes the macro-common register block 11, memory macros 12-1, 12-2, 12-3, . . . , logic circuits 13-1 to 13-$n$ and storage circuit (nonvolatile memory) 14.

The macro-common register block 11 is commonly used by the memory macros 12-1, 12-2, 12-3, . . . . The macro-common register block 11 includes macro-common registers 15$a$ to 15$d$ which latch address data AFIN stored in the storage circuit 14 at the turn-ON time of the power supply. The macro-common registers 15$a$ to 15$d$ configure a serial chain. That is, the macro-common registers 15$a$ to 15$d$ are configured so that data FIN input from the storage circuit 14 to the macro-common register 15$a$ will be sequentially transferred from the preceding-stage macro-common register to the next-stage macro-common register.

The memory macros 12-1, 12-2, 12-3, . . . are serially connected and address signals ADD0 <2:0> (ADD0<0>, ADD0<1>, ADD0<2>) and a monitor signal MON0 output from the macro-common registers 15a to 15d are supplied to the memory macro 12-1.

Output signals ADD1<2:0> and MON1 of the memory macro 12-1 are supplied to the memory macro 12-2. Output signals ADD2<2:0> and MON2 of the memory macro 12-2 are supplied to the memory macro 12-3. Output signals ADD3<2:0> and MON3 of the memory macro 12-3 are supplied to a next-stage memory macro. Likewise, output signals of a preceding-stage memory macro are sequentially supplied to a next-stage memory macro.

The logic circuits 13-1, 13-2, 13-3, . . . are provided in correspondence to the memory macros 12-1, 12-2, 12-3, . . . and transfer data with respect to the corresponding memory macros 12-1, 12-2, 12-3, . . . For example, data read out from the memory macro is logically processed by the corresponding logic circuit and data logically processed by the logic circuit is programmed into the corresponding memory macro.

As representatively indicated by the memory macro 12-1, each of the memory macros 12-1, 12-2, 12-3, . . . includes a subtracter 41, buffer 42, AND circuit 43, transfer gate 44 and inverter 45.

In each of the memory macros 12-1, 12-2, 12-3, . . . , an input address signal ADD<2:0> is supplied to the subtracter 41, subjected to the subtraction process and then supplied to the next-stage memory macro. Further, the monitor signal MON0 is supplied to the next-stage memory macro via the buffer 42. An inverted signal of the address signal ADD<2:0> and the monitor signal MON0 are input to the AND circuit 43. A selection signal SEL output from the AND circuit 43 is supplied to the gate of an N-channel MOS transistor configuring the transfer gate 44 and, at the same time, supplied to the gate of a P-channel MOS transistor configuring the transfer gate 44 via the inverter 45. One end of the transfer gate 44 is connected to an internal power supply V0 and the other end thereof is connected to a power supply monitoring pad 46.

With the above configuration, when it is desired to monitor the internal power supply V0 of the memory macro 12-1, "000" is programmed into the macro-common registers 15a, 15b, 15c which output the address signals ADD0<2:0> and "1" is programmed into the macro-common register 15d which outputs the monitor signal MON0. As a result, the relation of ADD0<2:0>="000", ADD1<2:0>="111", ADD2<2:0>="110" and ADD3<2:0>="101" can be attained. Therefore, the selection signal SEL only of the AND circuit 43 of the memory macro 12-1 corresponding to the address signal ADD<2:0>="000" is set to the "1" level to turn ON the transfer gate 44. Thus, the potential of the internal power supply V0 of the memory macro 12-1 is applied to the power supply monitoring pad 46 via a wiring VMON. By measuring the potential of the pad 46, the potential of the internal power supply V0 of the memory macro 12-1 can be monitored.

When it is desired to monitor the internal power supply V0 of the memory macro 12-2, "001" is programmed into the macro-common registers 15a, 15b, 15c, which output the address signals ADD0<2:0>, and "1" is programmed into the macro-common register 15d, which outputs the monitor signal MON0. As a result, the relation of ADD0<2:0>="001", ADD1<2:0>="000", ADD2<2:0>="111" and ADD3<2:0>="110" can be attained. Therefore, the selection signal SEL only of the AND circuit 43 of the memory macro 12-2 corresponding to the address signal ADD<2:0>="000" is set to the "1" level to turn ON the transfer gate 44. Thus, the potential of the internal power supply V0 of the memory macro 12-2 is applied to the power supply monitoring pad 46 via the wiring VMON. By measuring the potential of the pad 46, the potential of the internal power supply V0 of the memory macro 12-2 can be monitored.

Likewise, when it is desired to monitor the internal power supply V0 of the memory macro 12-3, "010" may be programmed into the macro-common registers 15a, 15b, 15c which output the address signals ADD0<2:0> and "1" may be programmed into the macro-common register 15d which outputs the monitor signal MON0.

With the configuration shown in FIG. 6, the independent operation can be performed for each memory macro and the potential of the internal power supply of each memory macro can be monitored at the test time.

In the above explanation, a case wherein the output signals ADD0<2:0> of the macro-common registers 15a to 15c are supplied to the subtracter 41 is explained. However, even if an adder is used instead of the subtracter, substantially the same operation can be performed and the same operation and effect can be attained.

Fourth Embodiment

Figure 7:
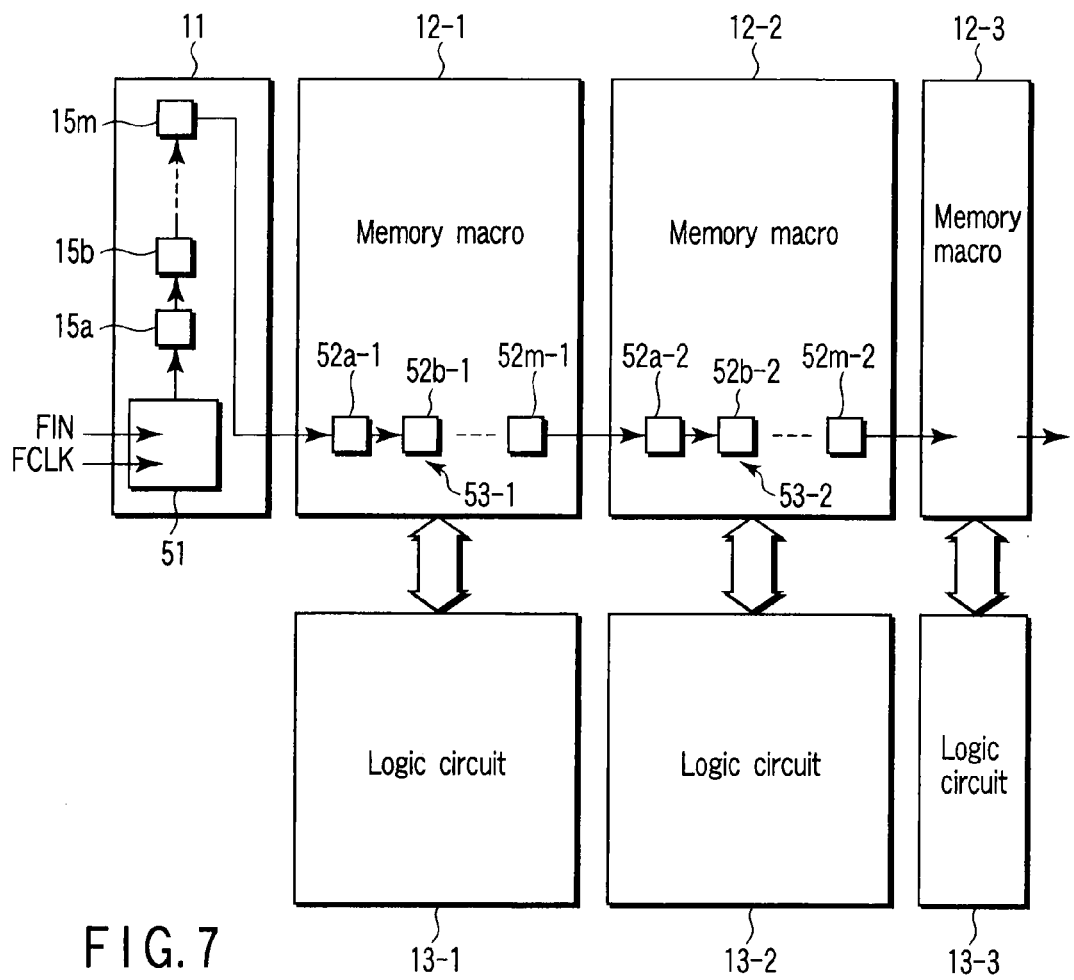
FIG. 7 is a block diagram showing the schematic configuration of an extracted main portion of a logic embedded memory, for illustrating a semiconductor integrated circuit device according to a fourth embodiment of this invention.

Next, a semiconductor integrated circuit device according to a fourth embodiment of this invention is explained with reference to FIG. 7. FIG. 7 is a block diagram showing an extracted main portion of a logic embedded memory. The logic embedded memory includes a macro-common register block 11, memory macros 12-1, 12-2, 12-3, . . . and logic circuits 13-1, 13-2, 13-3, . . . .

The macro-common register block 11 is commonly used by the memory macros 12-1, 12-2, 12-3, . . . . The macro-common register block 11 includes a data transfer/receiving circuit 51 and macro-common registers 15a, 15b, . . . , 15m. The data transfer/receiving circuit 51 is supplied with memory data FIN of a storage circuit 14 and a transfer clock control clock FCLK. The data transfer/receiving circuit 51 has a transfer control function of storing data FIN read out from the storage circuit 14 into the registers 15a, 15b, . . . , 15m. The macro-common registers 15a, 15b, . . . , 15m configure a serial chain.

The memory macros 12-1, 12-2, 12-3, . . . are serially connected and each of the memory macros 12-1, 12-2, 12-3, . . . includes memory-macro-contained individual registers 52a-1, 52b-1, . . . , 52m-1, 52a-2, 52b-2, . . . , 52m-2, . . . . The memory-macro-contained individual registers 52a-1, 52b-1, . . . , 52m-1, 52a-2, 52b-2, 52m-2, . . . configure memory-macro individual chains 53-1, 53-2, . . . and mainly store redundant data items. Redundant data items output from the memory-macro individual chains 53-1, 53-2, . . . are sequentially transferred to the next-stage memory macros 12-2, 12-3, . . . . The redundant data is used when a faulty memory cell is compensated for by replacing the faulty memory cell by a redundant memory cell.

The logic circuits 13-1, 13-2, 13-3, . . . are provided in correspondence to the memory macros 12-1, 12-2, 12-3, . . . and transfer data with respect to the corresponding memory macros 12-1, 12-2, 12-3, . . . . For example, data read out from the memory macro is logically processed by the corresponding logic circuit and data logically processed by the logic circuit is programmed into the corresponding memory macro.

With the above configuration, an output signal of the data transfer/receiving circuit 51 is input to the macro-common register 15a and an output signal thereof is sequentially supplied to the next-stage macro-common registers 15-b, . . . , 15m. An output signal of the final-stage macro-common register 15m is output to the exterior of the macro-common register block 11. An output signal of the macro-common register block 11 is input to the memory macro 12-1 and supplied to the first-stage memory-macro-contained individual register 52a-1 configuring the serial chain 53-1 in the memory macro 12-1. An output signal of the final-stage register 52m-1 of the macro-contained individual register chain 53-1 is output from the same Y position on the side opposite to side of the input stage of the memory macro.

An output signal of the memory macro 12-1 is input to the memory-macro-contained individual register chain 53-2 of the adjacent memory macro 12-2. In the same manner, an output signal of the preceding-stage memory macro is sequentially supplied to the next-stage memory macro.

With the above configuration, the memory data FIN of the storage circuit 14 can be transferred simply by tiling the macro-common register block and a plurality of memory macros.

Further, since not only the macro-common registers 15a, 15b, . . . , 15m but also the data transfer/receiving circuit 51 can be commonly used by the memory macros 12-1, 12-2, 12-3, . . . , the pattern-occupied area can be reduced and the degree of freedom of the arrangement of the register blocks and memory macros can be enhanced by reducing the number of unnecessary extension wirings.

Fifth Embodiment

Figure 8:
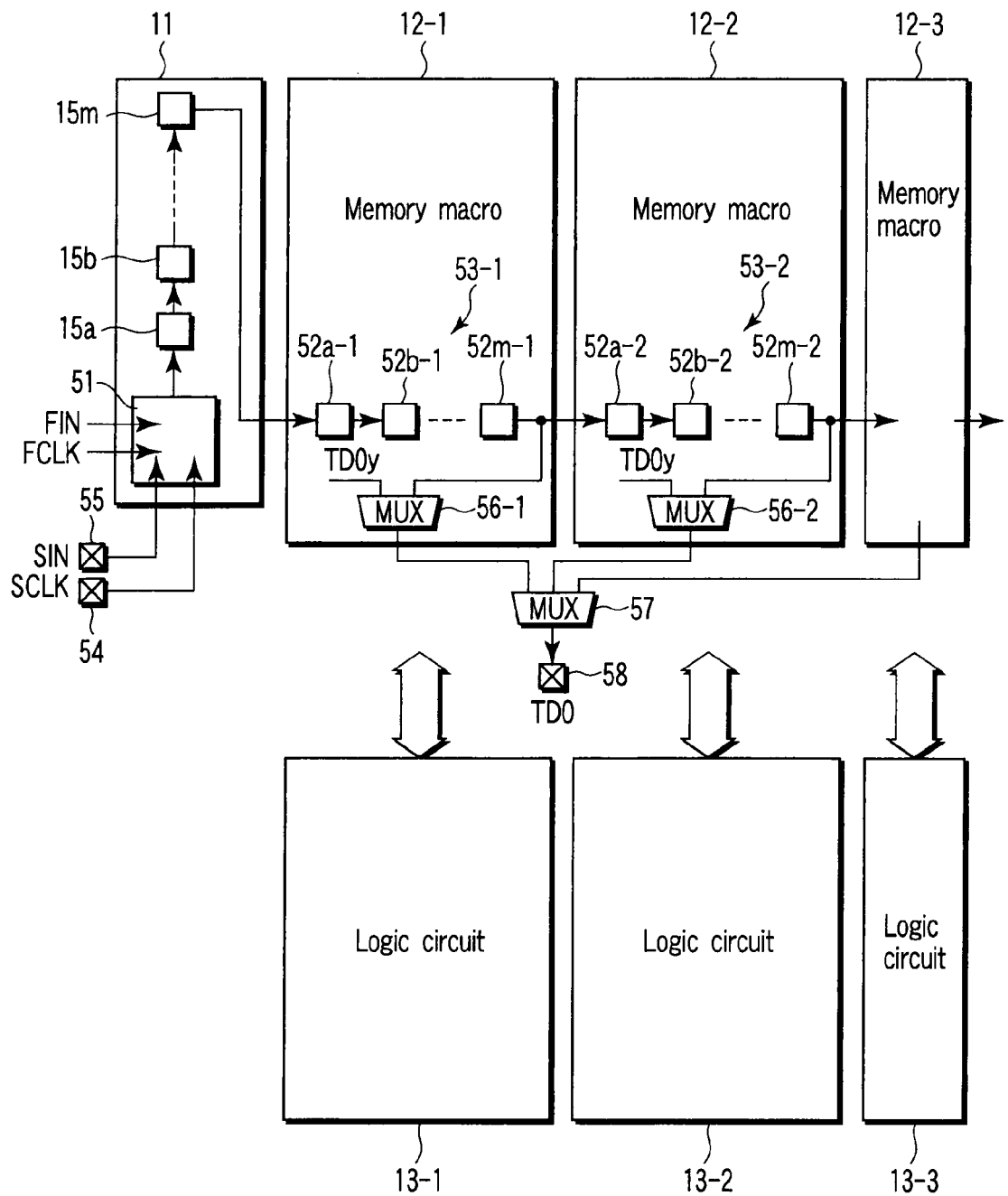
FIG. 8 is a block diagram showing the schematic configuration of an extracted main portion of a logic embedded memory, for illustrating a semiconductor integrated circuit device according to a fifth embodiment of this invention.

FIG. 8 is a block diagram showing the schematic configuration of an extracted main portion of a logic embedded memory, for illustrating a semiconductor integrated circuit device according to a fifth embodiment of this invention. The circuit shown in FIG. 8 is configured to make a test for the chain of the macro-common registers 15a, 15-b, . . . , 15m and the chains 53-1, 53-2, . . . of the macro-contained individual registers 52a-1, 52b-1, . . . , 52m-1, 52a-2, 52b-2, 52m-2, . . . when the configuration of the fourth embodiment shown in FIG. 7 is used.

In FIG. 8, the same reference symbols are attached to the same constituents as those of FIG. 7 and the detailed explanation thereof is omitted.

That is, an input terminal 54 for a clock signal SCLK used to test-read the chain of the macro-common registers and the chains of the macro-contained individual registers and an input terminal 55 for data SIN are provided in the data transfer/receiving circuit 51. The data transfer/receiving circuit 51 is configured to store data FIN of the storage circuit 14 into the macro-common registers 15a, 15b, . . . , 15m and the macro-contained individual registers 52a-1, 52b-1, . . . , 52m-1, 52a-2, 52b-2, . . . , 52m-2, . . . at the turn-ON time of the power supply. After this, the serial chains of the macro-common registers 15a, 15b, . . . , 15m and the macro-contained individual registers 52a-1, 52b-1, . . . , 52m-1, 52a-2, 52b-2, . . . , 52m-2, . . . are driven by use of the terminals 54, 55 so as to permit data SIN from the terminal 55 to be programmed.

Further, multiplexers (MUX) 56-1, 56-2, . . . are provided in the memory macros 12-1, 12-2, 12-3, . . . . A test data output signal TD0y used when each memory macro is tested is supplied to the first input terminals of the multiplexers 56-1, 56-2, . . . and output signals of the macro-contained registers 52m-1, 52m-2, . . . are respectively supplied to the second input terminals thereof.

The output signals of the multiplexers 56-1, 56-2, . . . are supplied to a multiplexer 57 provided outside the memory macros 12-1, 12-2, 12-3, . . . and output to the exterior from a pad 58 as an output signal TD0.

Switching of the multiplexers 56-1, 56-2, . . . is made depending on whether the operation is set in a test mode or not. In the test mode, one of the output signals of the macro-contained individual registers 52m-1, 52m-2, . . . is selected and, in the normal operation mode, the test data output TD0y of each memory macro is selected. The multiplexer 57 selects one of the memory macros to be tested.

With the above configuration, the chain of the macro-common registers 15a, 15b, . . . , 15m and the chains 53-1, 53-2, . . . of the macro-contained individual registers 52a-1, 52b-1, . . . , 52m-l, 52a-2, 52b-2, . . . , 52m-2, . . . can be tested by use of a normal test path.

As described above, according to one aspect of this invention, there is provided a semiconductor integrated circuit device having a plurality of memory macros in which the pattern-occupied area can be reduced and the high degree of freedom of the arrangement can be attained.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor integrated circuit device comprising:
a plurality of memory macros having memory cells which store data;
a nonvolatile storage circuit which stores a plurality of data items for tuning operations of the plurality of memory macros;
a macro-common register block provided outside the plurality of memory macros and having macro-common registers which sequentially distribute memory macro operation specifying signals for tuning operations of the plurality of memory macros, to the plurality of memory macros, the macro-common registers being connected in serial to the nonvolatile storage circuit to serially store, upon power on, the plurality of data items for tuning operations of the plurality of memory macros and stored in the nonvolatile storage circuit; and
memory macro operation setting circuits which are respectively provided in the plurality of memory macros and configured to set operating states of the plurality of memory macros according to the memory macro operation specifying signals supplied from the macro-common registers.

2. The semiconductor integrated circuit device according to claim 1, wherein the plurality of memory macros are serially connected and arranged adjacent to the macro-common register block and the memory macro operation specifying signals output from the macro-common registers are sequentially distributed from a first stage of the plurality of memory macros to a final stage of the plurality of memory macros.

3. The semiconductor integrated circuit device according to claim 1, wherein the plurality of memory macros are serially connected and arranged to sandwich the macro-common register block and the memory macro operation specifying signals output from the macro-common registers are sequentially distributed to final-stage memory macros from first-stage memory macros which are arranged adjacent to both ends of the macro-common registers.

4. The semiconductor integrated circuit device according to claim 1, further comprising buffers which are respectively provided in the plurality of memory macros and that each output the memory macro operation specifying signal to a next-stage memory macro in response to the memory macro operation specifying signal.

5. The semiconductor integrated circuit device according to claim 1, further comprising a decoder provided in the macro-common register block, and that is selectively supplied with signals and in which data is fetched into the macro-common register by a control operation by use of an output signal of the decoder.

6. The semiconductor integrated circuit device according to claim 1, further comprising:
   macro-contained inherent registers respectively provided in the plurality of memory macros; and
   a receiving circuit provided in the macro-common register block and configured to receive data to be stored in the macro-common registers and in which the macro-common registers and macro-contained inherent registers respectively configure serial chains,
   wherein data received by the receiving circuit is input to a first stage of the macro-common registers, and an output of a final stage of the macro-common registers is supplied to the macro-contained inherent register in the first stage memory macro and sequentially transferred to the macro-contained inherent registers in the plurality of memory macros.

7. The semiconductor integrated circuit device according to claim 6, further comprising a pad used to output data of the macro-contained register of each memory macro to the exterior of the semiconductor integrated circuit device and in which a test is made based on data read out from the pad.

8. The semiconductor integrated circuit device according to claim 6, wherein each of the plurality of memory macros further includes a first multiplexer to which an output signal of the macro-contained inherent register and a test data read-out signal used to test the plurality of memory macros are input.

9. The semiconductor integrated circuit device according to claim 8, further comprising:
   a second multiplexer provided outside the plurality of memory macros and supplied with output signals of the first multiplexers in the plurality of memory macros; and
   a pad which outputs an output signal of the second multiplexer to the exterior.

10. The semiconductor integrated circuit device according to claim 1, wherein at least part of the memory macro operation specifying signals is transferred along a signal line which is extended on a decoupling capacitor formed in each of the plurality of memory macros.

11. The semiconductor integrated circuit device according to claim 1, wherein at least part of the memory macro operation specifying signals is transferred along a signal line which is extended on an internal power supply voltage generating circuit formed in each of the plurality of memory macros.

12. The semiconductor integrated circuit device according to claim 1, wherein the plurality of memory macros include a plurality of array segments and at least part of the memory macro operation specifying signals is transferred along a signal line which is extended on a region between the plurality of array segments.

13. The semiconductor integrated circuit device according to claim 12, wherein each of the plurality of array segments includes
   a memory cell array;
   a row decoder used to decode a row address signal; and
   a sense amplifier used to sense and amplify data read out from a memory cell in the memory cell array;
   the semiconductor integrated circuit device further comprising:
   a secondary sense amplifier arranged in a region between the array segments and select and access the sense amplifier in the plurality of array segments;
   an input/output buffer supplied with an output signal of the secondary sense amplifier; and
   an input/output line used to transfer data with respect to the input/output buffer.

14. The semiconductor integrated circuit device according to claim 13, wherein at least part of the memory macro operation specifying signals is transferred along a signal line which is extended in a direction perpendicular to the data input/output line in each of the plurality of memory macros.

15. The semiconductor integrated circuit device according to claim 13, wherein the memory cell array further includes:
   word lines which are selectively activated by the row decoder;
   bit lines arranged in a direction to cross the word lines;
   a DQ line which connects the sense amplifier to the secondary sense amplifier, and
   an RWD line which connects the secondary sense amplifier to the input/output buffer,
   wherein the bit lines are formed of a first-level metal layer, the word lines are backed with a second-level metal layer, the DQ line is formed of a third-level metal layer, the RWD line is formed of a fifth-level metal layer, and the signal line used to transfer the memory macro operation specifying signals is formed of a fourth-level metal layer extended in a direction perpendicular to the input/output line.

16. The semiconductor integrated circuit device according to claim 1, wherein the plurality of memory macros are substantially a same circuit configuration and same pattern layout.

* * * * *